United States Patent
Kiryu

(10) Patent No.: US 7,681,098 B2
(45) Date of Patent: Mar. 16, 2010

(54) SYSTEMS AND METHODS FOR IMPROVED FAULT COVERAGE OF LBIST TESTING

(75) Inventor: Naoki Kiryu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 883 days.

(21) Appl. No.: 11/379,421

(22) Filed: Apr. 20, 2006

(65) Prior Publication Data

US 2007/0273401 A1    Nov. 29, 2007

(51) Int. Cl.
*G01R 31/28* (2006.01)
(52) U.S. Cl. .................... 714/733; 714/728; 714/739
(58) Field of Classification Search .............. 714/724, 714/726, 728, 738, 739, 733, 734, 30; 716/4
See application file for complete search history.

(56) References Cited

U.S. PATENT DOCUMENTS

| | | | |
|---|---|---|---|
| 6,636,997 B1 | 10/2003 | Wong et al. | |
| 6,816,990 B2 | 11/2004 | Song et al. | |
| 7,055,077 B2* | 5/2006 | Kiryu et al. | 714/726 |
| 2003/0112875 A1* | 6/2003 | Kondo et al. | 375/240.24 |
| 2005/0138509 A1* | 6/2005 | Kiryu et al. | 714/726 |

* cited by examiner

*Primary Examiner*—Phung M Chung
(74) *Attorney, Agent, or Firm*—Law Offices of Mark L. Berrier

(57) ABSTRACT

Systems and methods for improved fault coverage of logic built-in-self-tests (LBISTs) in integrated circuits (ICs) by determining weighting and/or seed values to be used in generating pseudorandom test bit patterns for each channel to optimize fault coverage. In one embodiment, a method includes generating a pseudorandom sequence of bits, applying a weighting value to the sequence, propagating the weighted sequence through one or more levels of logic, and capturing the resulting data. Metrics are then applied to the captured data to determine the suitability or optimality of the weighting value, and an optimal weighting value is selected. This may be performed for a plurality of trial values for each of a number of channels to obtain a set of weighting values for the different LBIST channels. The method may also include determining a seed value for the pseudorandom bit pattern generator.

9 Claims, 7 Drawing Sheets

SYSTEMS AND METHODS FOR IMPROVED FAULT COVERAGE OF LBIST TESTING

BACKGROUND

1. Field of the Invention

The invention relates generally to test methods, and more particularly to systems and methods for providing improved fault coverage of logic built-in-self-tests in integrated circuits by controlling the composition of the test input patterns.

2. Related Art

As digital devices (e.g., integrated circuits) have become more complex and more densely packed with logic gates and other electronic components, the need for effectively testing these devices has become more important. As the complexity of these devices increases, there are more and more opportunities for manufacturing defects to occur, thereby impairing or impeding the proper operation of the devices. The testing of these devices is becoming increasingly important. With respect to the testing of devices, and more particularly manufactured integrated circuits (ICs), one mechanism that is very useful is a built-in self test (BIST). This may also be referred to as a logic built-in self test (LBIST).

BIST and LBIST methodologies are generally considered part of a group of methodologies referred to as design-for-test (DFT) methodologies. DFT methodologies involve incorporating features into the actual designs of the circuits to facilitate testing of the circuits. BIST methodologies involve incorporating circuit components into the design of the circuit to be tested, where the additional circuit components are used for purposes of testing the functional portion of the circuitry.

In a typical LBIST system, LBIST circuitry within a device under test includes a plurality of scan chains interposed between levels of the functional logic of the device. Typically, pseudorandom patterns of bits are generated and stored in the scan chains. This may be referred to as scanning the data into the scan chains (during a scan shift phase). After a pseudorandom bit pattern is scanned into a scan chain, the data is propagated through the functional logic to a subsequent scan chain (during a functional phase). The data is then scanned out of the subsequent scan chain and compressed to reduce storage and bandwidth requirements, for example, through the use of a multiple input signature register, or MISR (during a scan shift phase) This test loop is typically repeated many times (e.g., 10,000 interations,) with the results of each test loop being combined in some manner with the results of the previous test loops. After all of the scheduled test loops have been completed, the final result is compared to a final result generated by a device that is known to operate properly operated in an identical test (using identical input data processed identically.) Based upon this comparison, it is determined whether the device under test operated properly.

Because the use of pseudorandom patterns is not deterministic (e.g., it does not test each and every possible combination of inputs, states and outputs), it does not provide the simple result that the logic circuit either does or does not have any defects. Instead, it provides a level of confidence that the logic circuit does or does not have defects. The greater the number of inputs and states that are tested (i.e., whose outputs are compared to expected values), the higher the confidence level that any defects have been identified by the testing. The number of random test patterns that are needed to achieve a particular level of confidence that the logic circuit contains no defects depends on the design of the logic circuit. This non-deterministic testing approach is typically easier and less expensive to implement than a deterministic approach.

In some conventional LBIST systems, the pseudorandom patterns may be weighted. Without weighting, the number of 1's in a random pattern is likely to be very nearly the same as the number of 0's. Weighting can be implemented in order to cause the generated pseudorandom pattern to have more 1's than 0's, or vice versa. For instance, it may be desirable to generate an input test pattern that has 30 percent 0's and 70 percent 1's. The weighted input test patterns may provide improved fault coverage in testing functional logic that may, during normal operation, have many inputs that are 1's (or many inputs that are 0's). If the coverage of each LBIST test can be improved, the amount of LBIST testing which needs to be performed to achieve a desired confidence level (that a device under test has no defects) can be reduced, thereby reducing test time and cost.

Conventionally, a single weighting value is applied to all of the pseudorandom input bit patterns. This weighting value (as well as the seed value for the pseudorandom pattern generator) is typically determined by empirical methods (e.g., trial and error). It would be desirable to provide improved systems and methods for determining optimal weighting for the pseudorandom bit patterns and optimal seed values. What defines optimal (i.e., best,) for a given device of use of a device, can vary. Means for determining optimal weighting would be even more desirable in an LBIST system (not known in the prior art) that utilizes different weighting values for one or more of the different channels (scan chains).

SUMMARY OF THE INVENTION

One or more of the problems outlined above may be solved by the various embodiments of the invention. Broadly speaking, the invention comprises systems and methods for improved performance of logic built-in-self-tests (LBISTs) in integrated circuits (ICs) by determining weighting and/or seed values to be used in generating pseudorandom test bit patterns for each channel to optimize fault coverage.

The invention may be implemented in a variety of ways, and various exemplary embodiments will be described in detail below. In one embodiment, this method may be implemented in LBIST circuitry, and may include the steps of generating a pseudorandom sequence of bits, applying a weighting value to the sequence (i.e., generating a weighted sequence by propagating the pseudorandom sequence through weighting logic controlled by a weighting value). The weighted sequence is then propagated through one or more levels of logic, and the resulting data is captured. Metrics are then applied to the captured data to determine the suitability or optimality of the weighting value. This may be performed for a plurality of trials for each of a number of channels to obtain a set of weighting values for the different LBIST channels. The method may also include determining a seed value for the pseudorandom bit pattern generator. The seed may be selected either manually or by application of a metric to several candidate seeds, and selection of the seed having the greatest evaluated value of the metric.

In one embodiment, a single seed value is first selected for a pseudorandom bit pattern generator. Then for each of a number of channels, each of a series of weighting values is applied to produce test input bit patterns. For each of the input bit patterns, a metric is applied to data resulting from the use of the input bit patterns. For example, a count of the number of differences between the initial and resulting values in output latches can be determined and the weighting value associated with the greatest number of differences can be deemed the optimal ("best") weighting value. The result is a set of weights, one for each of the channels. These weights can subsequently be used in testing.

Alternative embodiments may determine multiple weighting values in a given iteration. Alternative embodiments may also employ a group of metrics. Each metric may be appropriate to a specific channel. Alternatively, the metrics as a group may used to ensure more complete fault coverage. In different embodiments, a seed or set of seeds may be selected or generated manually, selected or generated algorithmically, or comprise an entire initial set. The embodiments may use a selection process employing metrics and information related to weighting values, input bit patterns, and calculated output bit patterns, for example. Some embodiments may employ measurements of specific latches to ensure that the logic has entered certain desired states, thereby increasing the level of confidence in the fault coverage.

In one embodiment, a system is implemented in an integrated circuit which incorporates components for a logic-built-in-self-test (LBIST). The LBIST components include a pseudorandom bit pattern generator (PRPG), a plurality of scan chains interposed between levels of the IC functional logic, and weighting logic coupling the PRPG to the scan chains. The weighting logic includes a weighting value register for each scan chain. The LBIST circuitry is configured to write weighted test patterns into and read computed patterns out of each of the scan chains. A weighted test pattern propagates from one scan chain through a level of functional logic to a subsequent scan chain. The input patterns are weighted to have various ratios of ones and zeros, and the weights are chosen to improve the test coverage of the system. In some embodiments the system further comprises a test bench that drives the system and is configured to generate and capture data to evaluate choices of weighting values and PRPG seeds.

In one embodiment, the weighting logic comprises a number of input ports, an output port, and intervening AND gates and MUX. One input is coupled directly to the MUX and each remaining input is couple to an AND gate. The output of each AND gate is coupled to both the MUX and a single AND gate. The result is a MUX output that has a probability of one as a value of ½, ¼, ⅛, and 1/16. Additionally, an XOR gate is couple to the MUX output to selectively provide the complement of the MUX resulting in an output of that has a probability of one as a value of ½, ¾, ⅞, and 15/16.

Numerous additional embodiments are also possible.

The various embodiments of the invention may provide a number of advantages over prior art systems and methods. For example, the ability to independently weight the data propagated through various blocks of functional logic may increases the fault coverage of individual LBIST tests and decrease the number of tests required to achieve a desired level of fault coverage. Still other advantages will be apparent to those of skill in the art of the invention.

BRIEF DESCRIPTION OF THE DRAWINGS

Other advantages of the invention may become apparent upon reading the following detailed description and upon reference to the accompanying drawings.

Figure 1:
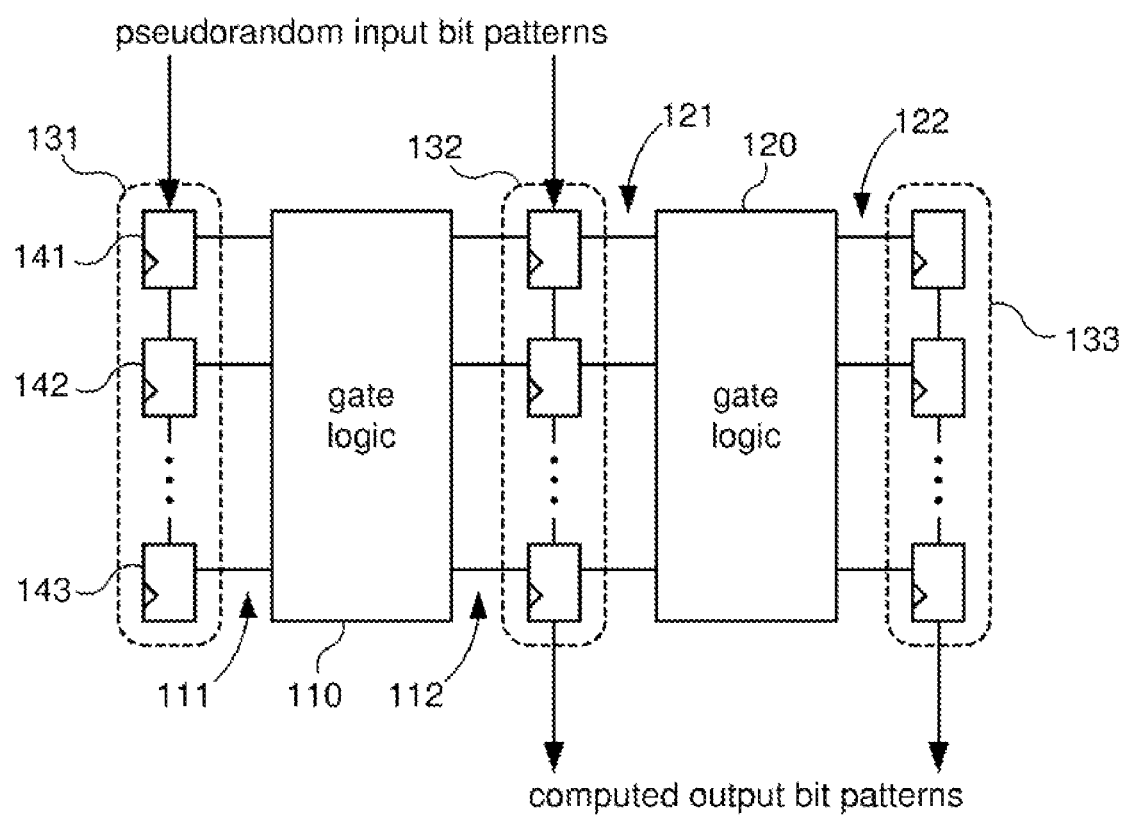
FIG. 1 is a functional block diagram illustrating the principal of operation of a simple STUMPS LBIST system in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives failing within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods associated with integrated circuits (ICs) to manage the composition of input test bit patterns to improve the fault coverage of logic built-in-self-tests (LBISTs).

The various embodiments of the invention may provide a number of advantages over conventional systems. For example, the coverage of a given number of tests is improved. This improves the level of confidence that defects in the circuitry are detected. Also, for a given level of confidence, the number of test required can be reduced compared with the number required of conventional methods.

In one embodiment, a STUMPS-type LBIST test architecture is incorporated into the design of a logic circuit. The LBIST components include a set of scan chains interposed between portions of the functional logic of the circuit. The LBIST components also include means for weighting pseudorandom bit patterns (controlling the proportion of 1's and 0's in the bit patterns) that are scanned into the scan chains and propagated through the functional logic. The weighting for each scan chain is separately programmable. The weighting value for each scan chain is determined by first selecting a first value and shifting a corresponding weighted bit pattern into the scan chain. The weighted bit pattern is propagated through the functional logic and a metric is determined for the weighting value to indicate the level of fault coverage corresponding to that value. This is repeated for several weighting values, and the value having the highest corresponding metric is selected for use with the scan chain during LBIST testing.

As noted above, an LBIST test typically involves executing a predetermined number of test loops and determining upon completion of the test whether a generated MISR signature matches an expected value (e.g. the signature value generated by a good device.) Usually, some number (e.g., 50) of LBIST tests will be performed on each production device to identify faults in the device. Each LBIST test generally uses a different seed for the pseudorandom bit pattern generator, and each test may apply a single weighting value to all of the scan chains. Each LBIST test may use a different seed value and/or weighting value to improve fault coverage. These seeds ad weighting values are typically determined by a user based on his or her experience, rather than a particular methodology.

The present systems and methods, unlike conventional systems and methods, enable the use of a different weighting value for each scan chain. This allows each LBIST test to achieve more effective fault coverage by allowing the weighting value for each scan chain to be tailored to that scan chain, independent of other scan chains. Because of the large number of scan chains, the selection of all of the weighting values for the scan chains based on a user's experience is impractical. It in therefore necessary to provide automated means to select optimal weighting values for each of the different scan chains (channels).

In one embodiment, a pseudorandom bit pattern generator seed is selected in conjunction with a weighting value for a first scan chain. For each of several possible combinations, bit patterns are generated and scanned into the first scan chain. The bit patterns are propagated through the corresponding functional logic, and corresponding metrics are determined. In one embodiment, the metric may be the number of bits in the computed pattern that change from the beginning of the functional phase to the end of the functional phase. The metrics for the different combinations of seeds and weighting values are then compared, and an optimal combination having the best (e.g., highest) metric is selected. Then, using the selected bit pattern generator seed, several different weighting patterns for a subsequent scan chain are tested in the same manner (i.e., generating bit patterns, scanning them through the corresponding functional logic, determining corresponding metrics, and selecting the value with the best metric.) This process is repeated for each of the scan chains until a seed for the pattern generator and weighting values for each of the scan chains has been selected. These will be used for the LBIST test during testing of production devices. As noted above, a number of these tests may be performed on each device, so the same process is performed to identify the seed and weighting values for each of these tests. Because of the improved fault coverage of each test, it is contemplated that fewer tests will be necessary than in prior art systems and methods.

Various embodiments of the invention will be described below. Primarily, these embodiments will focus on implementation of a STUMPS-type LBIST architecture which is implemented within an integrated circuit. It should be noted that these embodiments are intended to be illustrative rather than limiting, and alternative embodiments may be implemented in BIST architectures other than the STUMPS architecture, and may also be implemented in circuits whose components are not strictly limited to logic components (e.g., AND gates, OR gates, and the like). Many such variations will be apparent to persons of ordinary skill in the art of the invention and are intended to be encompassed by the appended claims.

Referring to FIG. 1 a functional block diagram illustrating the principal operation of a simple STUMPS LBIST system is shown for one embodiment. The LBIST system is incorporated into an integrated circuit. In this figure, the functional logic of the integrated circuit includes a first portion 110 and a second portion 120. Functional logic 110 is, itself, a logic circuit having a plurality of inputs 111 and a plurality of outputs 112. Similarly, functional logic 120 forms a logic circuit having a plurality of inputs 121 and a plurality and outputs 122. Functional logic 110 is coupled to functional logic 120 so that, in normal operation, outputs 112 of functional logic 110 serve as inputs 121 to functional logic 120.

Each of the inputs to, and outputs from, functional logic 110 and 120 is coupled to a scan latch. The set of scan latches 131 that are coupled to inputs 111 of functional logic 110 is referred to as a scan chain. The latches are serially coupled together so that bits of data can be shifted through the latches of a scan chain. For example, a bit may be scanned into latch 141, then shifted into latch 142, and so on, until it reaches latch 143. More specifically, as this bit is shifted from latch 141 into latch 142, a second bit is shifted into latch 141. As a bit is shifted out of each latch, another bit is shifted into the latch. In this manner, a series of data bits can be shifted, or scanned, into the set of latches in scan chain 131, so that each latch stores a corresponding bit. Data can likewise be scanned into the latches of scan chain 132.

Just as data can be scanned into the latches of a scan chain (e.g., 131,) data can be scanned out of the latches of a scan chain. As depicted in FIG. 1, the latches of scan chain 132 are coupled to the outputs of functional logic 110. Each of these latches can store a corresponding bit that is output by functional logic 110. After these output bits are stored in the latches of scan chain 132, the output data bits can be shifted through the series of latches and provided as a computed output bit stream. Data can likewise be scanned out of the latches of scan chain 133. It should be noted that the structure illustrated in FIG. 1 does not show data being scanned into scan chain 133, or data being scanned out of scan chain 131. Alternative embodiments may be configured to scan data in and out of these scan chains.

The LBIST system of FIG. 1 operates basically as follows. Pseudorandom bit patterns are generated and are scanned into the scan chains (131, 132) that are coupled to the inputs of functional logic 110 and 120. The pseudorandom it patterns that are stored in scan chains 131 and 132 are then propagated through the corresponding functional logic. That is, the bit pattern in scan chain 131 is propagated through functional logic 110, while the bit pattern in scan chain 132 is propagated through functional logic 120. Functional logic 110 and 120 process the inputs and generate a corresponding set of outputs. These outputs are captured (stored) in the scan chains (132 and 133) that are coupled to the outputs of the functional logic. The output bit patterns stored in scan chains 132 and 133 are then scanned out of these scan chains.

Figure 2:
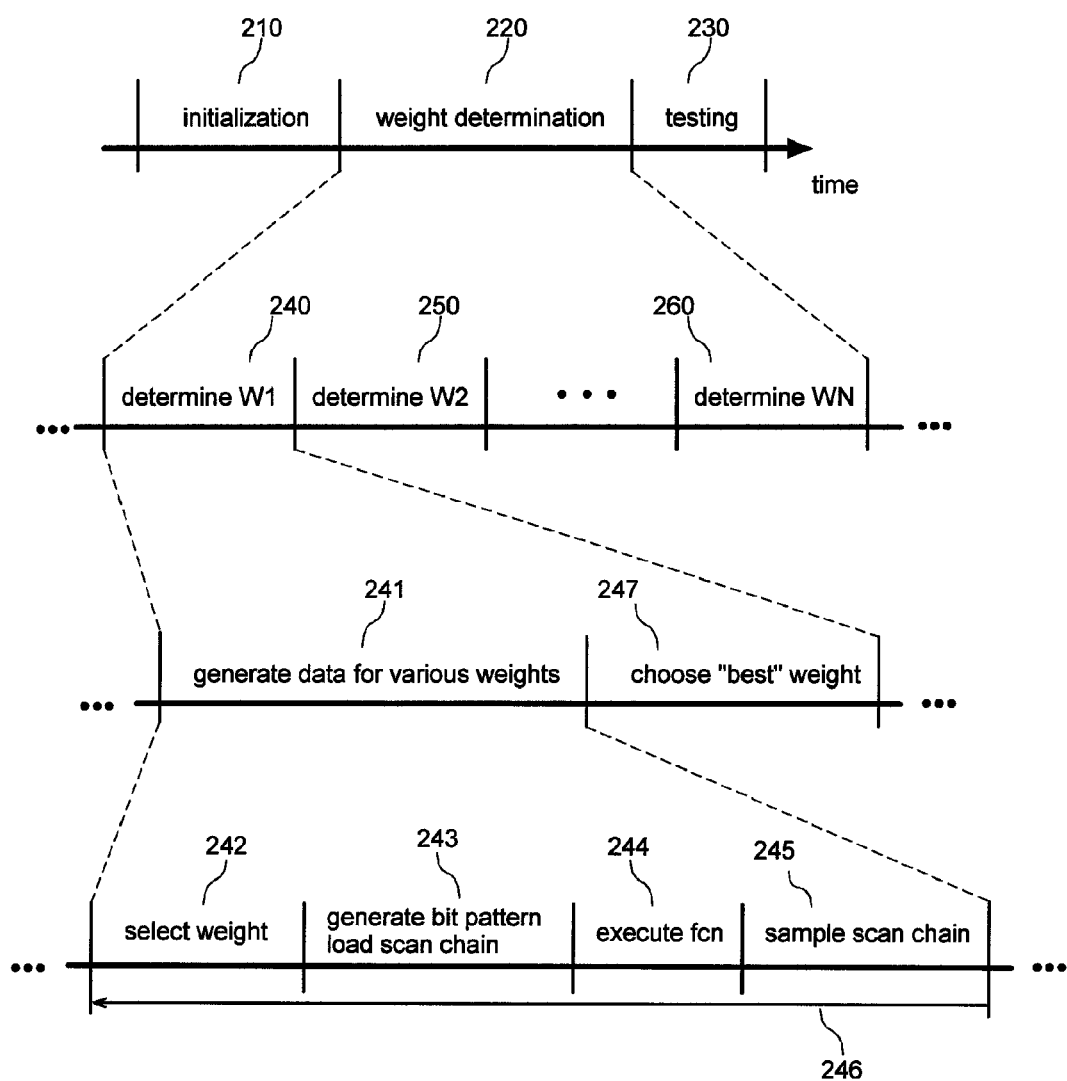
FIG. 2 is a diagram illustrating the phases of operation of an LBIST system in accordance with one embodiment.

Referring to FIG. 2, a diagram illustrating the phases of a weight determination method for an LBIST system in accordance with one embodiment is shown. FIG. 2 shows two different phases of the weight determination method: initialization 210; and weight determination 220. In the initialization phase, the various components of the system are prepared for normal operation. In the weight determination phase, input test patterns for a variety of weights are generated and propagated through the functional logic. The results are then used to choose an optimal weight for each of the scan chains. In some embodiments, the weight determination phase results in pattern generator seeds and weighting values that are stored for later use in LBIST testing. In other embodiments, the weight determination phase is followed by a test phase for the device in which the LBIST system is implemented.

As shown in FIG. 2, this embodiment begins with initialization phase 210. As noted above, the various components of the system are prepared for operation during this phase. As will be discussed in more detail, it may be necessary to ensure that several registers such as a number generator seed, a weight iteration counter, a block iteration counter, and channel (scan chain) weights have the appropriate values stored therein. After these and other operations are performed, the LBIST system is ready for operation.

After the LBIST system is initialized, the system begins weight determination phase 220. The purpose of this phase is to determine an optimal weight (i.e., best by some measure) for each block of target functional logic. During this phase, a subphase is executed for each block of target functional logic. That is, there are N subphases (240, 250, 260), one each for the N blocks of target functional logic. During each of the N subphases (e.g., 240), data is generated (241) and examined (247) to determine an optimal weight for the current block of target logic. To generate the evaluation data, a series of weights are used, iterating through each in turn (246). Each of the weights is used to generate input bit patterns that are scanned into input scan chains (243) and propagated through the target functional logic (244), resulting in computed output bit patterns. The input and output bit patterns are dumped or sampled (243, 245) and subsequently evaluated (247). The evaluation of the bit patterns results in the selection of a particular weight for each of the LBIST channels. In this embodiment, each of the weights is determined in turn, one through N, and a set of N weights determined for use in testing (W1, W2, . . . WN).

Figure 3:
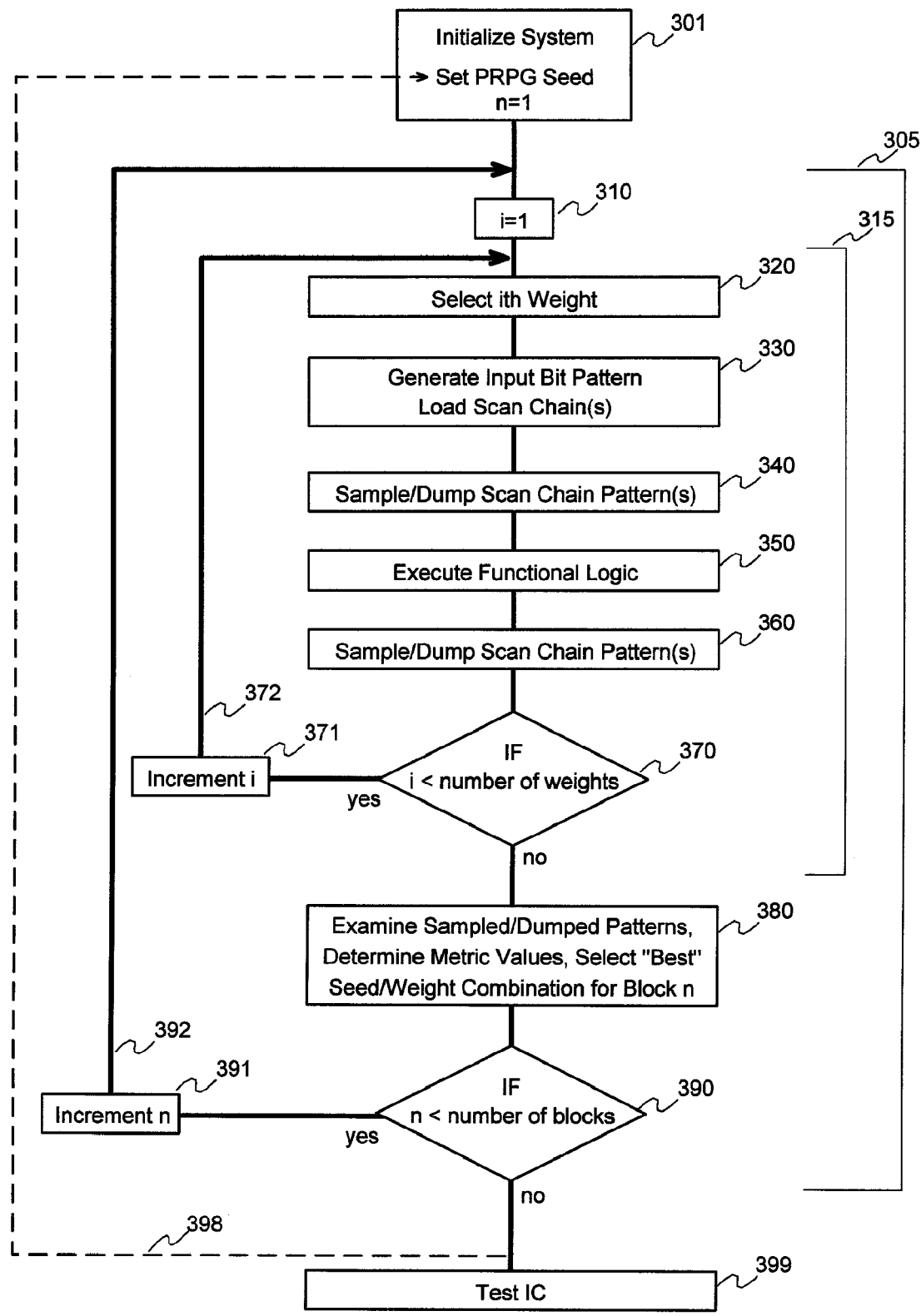
FIG. 3 is a flow diagram illustrating operations in accordance with one embodiment.

The operation of the LBIST system of one embodiment is summarized in FIG. 3. FIG. 3 is a flow diagram illustrating a method by which the weighting values are determined in one embodiment. During initialization 301 the PRPG is initialized using a first seed. A combination of nested loops (315 within 305) is then entered. A first loop (305) iterates through each target functional block. This loop includes an inner second loop (315) and an evaluation (380) of the data produced by the inner, second loop. The inner, second loop (315) iterates on a sequence of weights (320). For each weight, the PRPG-produced pseudorandom bit sequence is processed by the weight logic, resulting in an input bit pattern of the specified weight (i.e., specified probability of a bit having a value of one), which is then scanned into the scan chains (330), sampled/dumped for later evaluation (340), and propagated through the target functional logic (350). The computed output bit pattern from the target functional logic is sampled/dumped (360) to be compared later to the previously stored bit patterns. (Depending on the operation of the PRPG and the desire to reproduce certain pseudorandom bit sequences, the PRPG may need to be reinitialized within the nested loops.)

Inner loop 315 begins each iteration with a new weight. Having iterated through a sequence of weights, the inner loop is exited at 370 and the stored bit patterns associated with each weight are evaluated. In this embodiment, the weights are evaluated using a changed-bits metric. It is generally accepted in the field of LBIST testing that the number of bits in the output scan chains that change following the functional phase is a reasonably good indicator of the quality of coverage of the input bit patterns. The more bits that change, the better the coverage. An optimal weight can therefore be determined for the current LBIST channel (380) by selecting the weight that results in the highest number of bits that change as a result of the propagation of the input bit patterns through the functional logic during the functional phase. Alternative embodiments can, of course, use other metrics to determine the quality of the fault coverage associated with the different weights.

The next iteration of the outer, first loop (305: 390 to 391 to 392 to 310) is then undertaken for the next LBIST channel, and so forth. After all of the weights for all of the LBIST channels have been evaluated, a complete set of parameters for the LBIST test (i.e., a seed value and a weight for each LBIST channel) has been selected. The outer loop is exited at 390. As noted above, LBIST testing on a production device typically includes multiple LBIST tests, so this process may be repeated to identify seeds and weights to be used in additional LBIST tests (e.g., 398). The seeds and weights can then be stored for use in the testing of the production devices.

Figure 4:
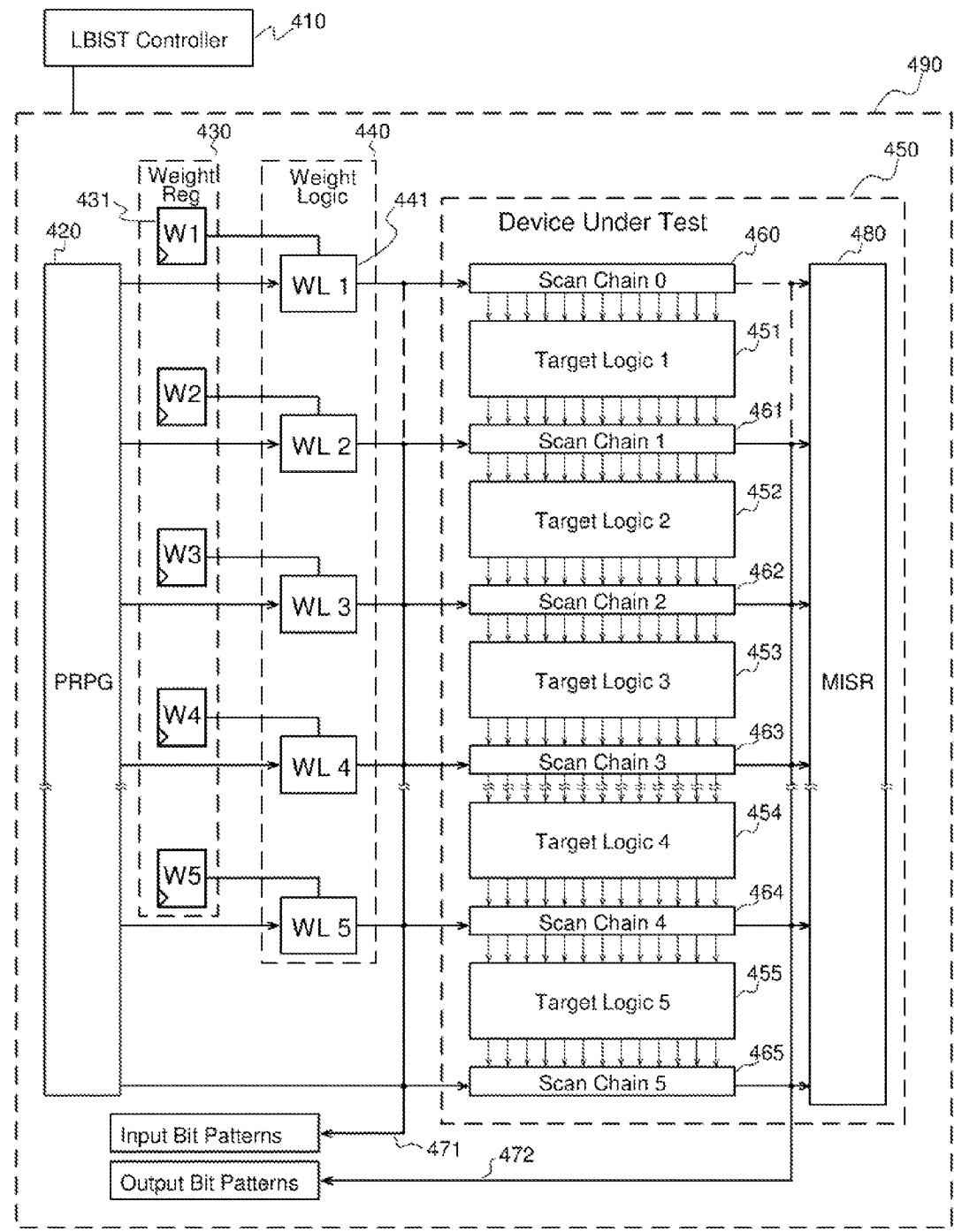
FIG. 4 is a functional block diagram illustrating the layout of a system in accordance with one embodiment.

Referring to FIG. 4, a block diagram illustrating the layout of an LBIST system in accordance with one embodiment is shown. The LBIST system of FIG. 4 utilizes scan chains as described in FIG. 1, and implements weight logic 440 and registers 430, and taps 471-472 to sample/dump scan chain bit patterns. The system operates basically as follows. Bits from a PRPG using a given seed are combined into a weighted pseudorandom bit pattern for each scan chain. The pattern is scanned into the scan chain, and propagated through the input ports of the functional logic coupled to the scan chain. The functional logic processes the inputs and generates a corresponding set of outputs that are captured in the scan chain coupled to the output ports of the functional logic. The output are bit patterns that, in normal LBIST testing, are scanned out of each scan chain and combined into a signature by a MISR. During the weight determination process, the input and output bit patterns stored in the scan chain prior and subsequent to execution of the functional logic, respectively, are sampled/dumped and used to evaluate the choice of weights.

In one embodiment, the LBIST system is implemented as shown in the functional block diagram of FIG. 4. As depicted in FIG. 4, the LBIST system implements a STUMPS architecture that comprises an LBIST controller 410, a PRPG 420, a set of weight registers 430, a set of weight logic blocks 440, a set of scan chains 460-465, bit pattern taps 471-472 and a MISR 480. These LBIST components are integrated with target logic circuits 451-455, which the LBIST components are designed to test. (It should be noted that MISR 480 is used to accumulate the output data during LBIST testing and is not used to determine the weights in this embodiment.)

LBIST controller 410 includes control circuitry that controls the operation of the remainder of the LBIST components. LBIST controller 410 generates the control signals necessary to execute the phases of operation depicted in FIG. 2 (i.e., the initialization and weight determination phases.) For purposes of clarity, LBIST controller 410 is depicted as being coupled to the IC and LBIST components 490 as a group, although the controller is typically coupled directly to each of the components. One of the functions of LBIST controller 410 is to provide a seed value to PRPG 420. Another is setting the weight values in weight registers 430. Based on the seed value, PRPG 420 generates a pseudorandom sequence of bits that are processed by weight logic 440 as commanded by the weights 430 providing input bit patterns loaded into scan chains 460-464. (The values/latches in scan chain 465 can be set as well so that the values are known.) Yet another function of the LBIST controller is to manage the sampling/dumping of the input and output bit patterns (via taps 471-472).

The pseudorandom bit patterns generated by PRPG 420 and weight logic 430 are loaded into scan chains 460-464 (and possibly 465). Each scan chain comprises a series of scan latches that are configured to alternately shift data (the pseudorandom bit patterns or functional logic output) through the scan chains, or to hold data that has been propagated through the functional logic. As indicated above, a separate sequence/pattern is loaded into each of scan chains 460-465. Each of scan chains 460-465 is positioned before or after (interposed with) respective blocks of target logic 451-455 of logic circuit 450. Thus, for each block of target logic circuit 450. Thus, for each block of target logic circuit 451-455, there is a scan chain (460-464) which precedes this portion and provides inputs to the corresponding logic, as well as a scan chain (461-465) which follows this portion and receives the output of the corresponding logic.

For example, consider a sequence of pseudorandom bits from PRPG 420 fed to weight logic 441. The value from weight register 431 determines the probability of a value of one (approximately the ratio of ones to total number of bits) in the input bit pattern scanned into scan chain 460. The input bits are sampled/dumped using tap(s) 471. Target logic 451 receives input bits from scan chain 460 and provides output bits to scan chain 461. The output bits are then scanned out of scan chain 461 into MISR 480. The output bits are sampled/dumped using tap(s) 472. Similarly, target logic 452 receives input bits from scan chain 461 and provides output bits to scan chain 462. Scan chains 461-464 serve both to provide input bits to a succeeding block of target logic and to receive output bits from a preceding block of target logic. Scan chain 460 only provides input bits and scan chain 465 only captures/stores output bits.

A scan chain latch changes value when overwritten by functional logic output of a different value. This is an indication that the functional logic immediately upstream from that latch was exercised, as were other parts of the logic. These changes can be determined by comparing the bit pattern scanned into a particular scan chain an the bit pattern scanned out of that same scan chain. Taps 471 and 472 permit access to the bit patterns scanned in and out of the scan chains, respectively.

The purpose of the pseudorandom sequence of bits generated by PRPG 420 is to provide a set of input bits to be propagated through the functional logic components of integrated circuit 490. In the absence of weight logic 440, the bit sequences provided to each of the scan chains would, on average, have the same number of zeros and ones. The purpose of weight logic 440 is to change the probability that the value of an input bit is one, thereby improving test coverage.

Figure 5:
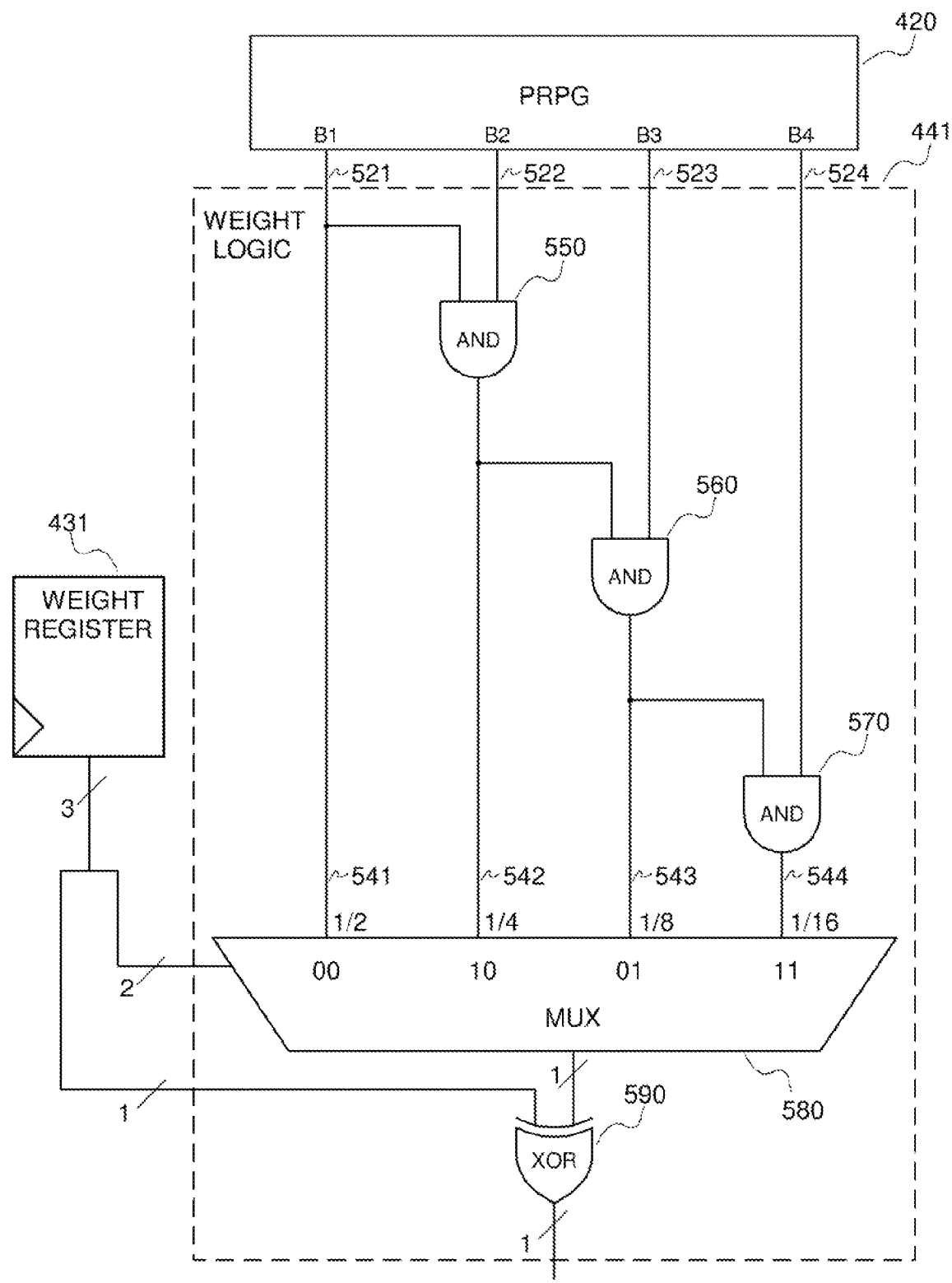
FIG. 5 is a functional block diagram illustrating the layout of weighting logic in accordance with one embodiment

Illustrated in FIG. 5 is a block diagram of weight logic as implemented in one embodiment. The weight logic comprises AND gates 550, 560, and 570, MUX 580, and XOR 590, and is controlled by a 3-bit value in weight register 431. The weight logic operates as follows. A sequence of pseudorandom bits is generated by PRPG 420. At any given time, four of these bits (B1, B2, B3, B4) are available to weight logic 441. These bits are used by weight logic 441 to generate an output bit, either by passing one of the bits through to MUX 580 or combining them in AND gates 550, 560, and/or 570. The 1-bit result is output by MUX 480 into XOR 490 and is then possibly negated in XOR 480 before being output by weight logic 441. The 3-bit value from weight register 431 is used to control MUX 580 and the possible negation of the bit output by MUX 580, thereby determining the probability of the output being one (1).

The first bit of the 3-bit value determines whether to negate (in XOR 590) the output of MUX 580. The second and third its are used to select between the MUX inputs 541-544. A weight register value of 00 for the latter two bits selects MUX input 541, which carries bit B1, passing this bit directly through from the PRPG. The probabilities of the bit being a zero or a one are equal. So, the likelihood is one in two (½) that the bit is 1. The negation of this result does not change the likelihood which remains one in two (½) that the bit is 1. A weight register value of 10 for the latter two bits selects MUX input 542, which is the result of ANDing two bits from the PRPG, via 521 and 522. There are four possible bit combinations/permutations input to AND gate 550, only one of which results in a bit value of 1. So, the likelihood that the bit value at 542 is 1 is one in four (¼). To change this likelihood to three in four (¾), the MUX output bit is negated in XOR 590 (when the first bit of the weight register value is set to 1). TABLE 1 lists each of the possible weight logic input bits and the corresponding output bit. The leftmost column contains all possible combinations/permutations of the four input bits. The remaining columns contain the output bit corresponding to the input to the left and the command at the top of the column. Given that the sets of input bits are appropriately distributed, the probabilities are as summarized at the end of the table.

TABLE I

Resulting Output Bit for Given Input Bits using Commanded Weight

| Input bits | Commanded Weight | | | | | | | |
|---|---|---|---|---|---|---|---|---|
| | 0 00 | 0 10 | 0 01 | 0 11 | 1 00 | 1 10 | 1 01 | 1 11 |
| 0 0 0 0 | 0 | 0 | 0 | 0 | 1 | 1 | 1 | 1 |
| 1 0 0 0 | 1 | 0 | 0 | 0 | 0 | 1 | 1 | 1 |
| 0 1 0 0 | 0 | 0 | 0 | 0 | 1 | 1 | 1 | 1 |
| 0 0 1 0 | 0 | 0 | 0 | 0 | 1 | 1 | 1 | 1 |
| 0 0 0 1 | 0 | 0 | 0 | 0 | 1 | 1 | 1 | 1 |
| 1 1 0 0 | 1 | 1 | 0 | 0 | 0 | 0 | 1 | 1 |
| 1 0 1 0 | 1 | 0 | 0 | 0 | 0 | 1 | 1 | 1 |
| 1 0 0 1 | 1 | 0 | 0 | 0 | 0 | 1 | 1 | 1 |
| 0 1 1 0 | 0 | 0 | 0 | 0 | 1 | 1 | 1 | 1 |
| 0 1 0 1 | 0 | 0 | 0 | 0 | 1 | 1 | 1 | 1 |
| 0 0 1 1 | 0 | 0 | 0 | 0 | 1 | 1 | 1 | 1 |
| 0 1 1 1 | 0 | 0 | 0 | 0 | 1 | 1 | 1 | 1 |
| 1 0 1 1 | 1 | 0 | 0 | 0 | 0 | 1 | 1 | 1 |
| 1 1 0 1 | 1 | 1 | 0 | 0 | 0 | 0 | 1 | 1 |
| 1 1 1 0 | 1 | 1 | 1 | 0 | 0 | 0 | 0 | 1 |
| 1 1 1 1 | 1 | 1 | 1 | 1 | 0 | 0 | 0 | 0 |
| Probability of a value of one | 8/16 (1/2) | 4/16 (1/4) | 2/16 (1/8) | 1/16 | 8/16 (1/2) | 12/16 (3/4) | 14/16 (7/8) | 15/16 |

Figure 6:
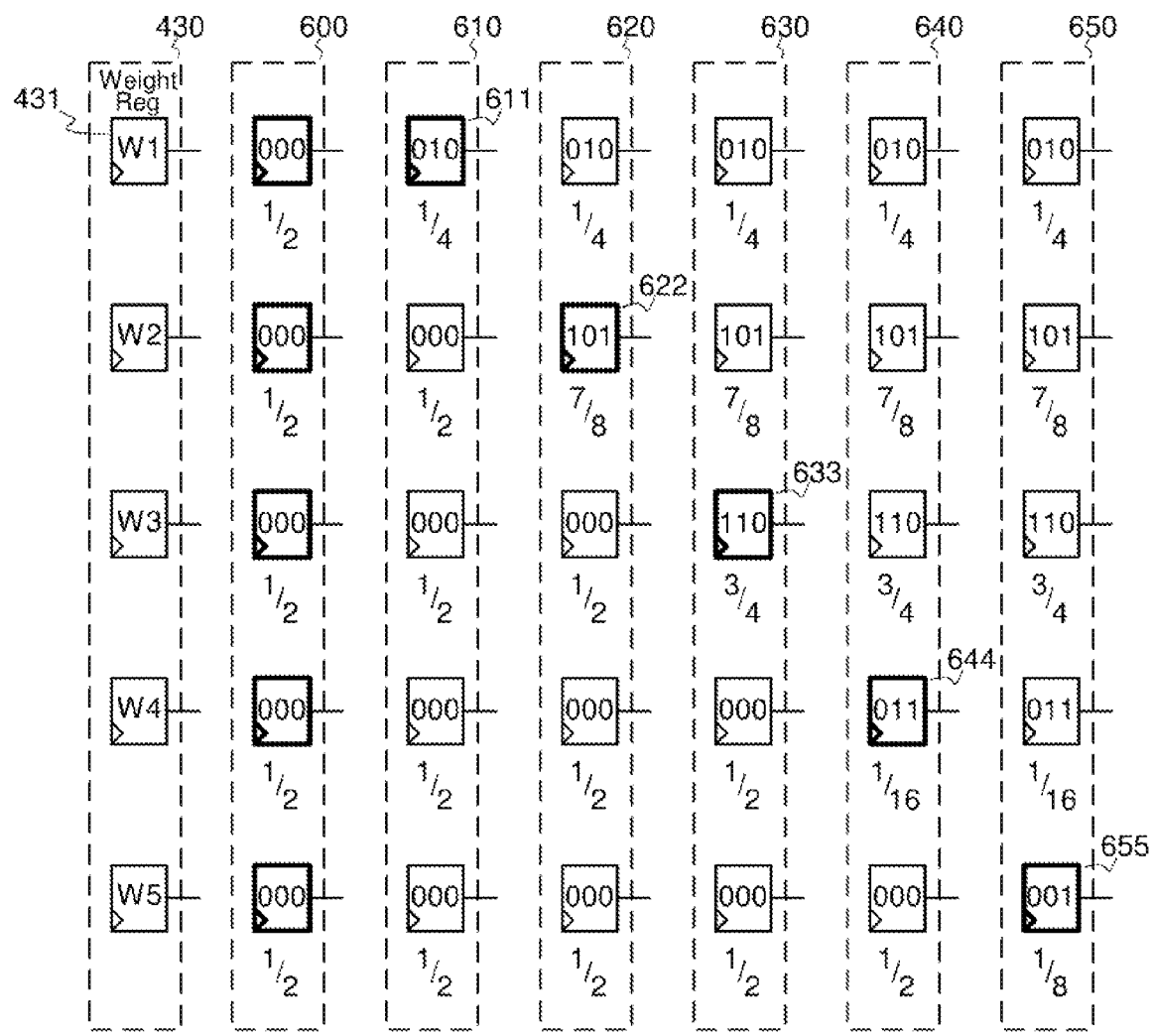
FIG. 6 is a diagram illustrating exemplary weighting register values and corresponding channel weights in accordance with one embodiment.

FIG. 6 illustrates a series of weight values for an example weight determination. The weight registers are depicted as arranged in FIG. 4. Weight registers 430 are shown at the left of FIG. 6. The weight registers are reproduced as 600-650 to the right of registers 430. Each of registers 600-650 represents weight registers 430 at a different time. In other words, weight registers 430 first contain the values shown in 600, then they contain the values shown in 610, and so on.

Each register contains a binary weight value. In registers 430, the weight values are indicated as W1-W5. In registers 600-650, the 3-digit weight values are shown explicitly. Below each sub-register within registers 600-650 is an annotation with the probability of a value of one that corresponds to the 3-digit weight value shown in the register. To simplify the following discussion, the ratio will be used.

The five registers are illustrated and are initialized to ½ (see 600). Then, weight W1 in the first weight register is successively set to ½, ¼, ⅛, 1/16, ¾, ⅞, and 15/16. Each is used to modify/weight a pseudorandom bit sequence into an input bit pattern which is sampled/dumped (as are those for the other scan chains) and propagated through a block of functional logic. The resulting output bit pattern from this current block is also sampled/dumped. The number of changed buts for the first LBIST channel (corresponding to the first weight register) is determined for each of the successive weight values. The weight with the greatest number of changed bits is identified as the optimal weight, so this weight is selected for the first LBIST channel and is stored in the first weight register. In this example, the optimal weight value is "010" (corresponding to a probability of ¼ of a one), as shown in register 611, So, after the first iteration of loop 315 the first weight is determined to be ¼ (see 611), and the others remain ½. After the second iteration of loop 315, the second weight is determined to be ⅞ (as shown in register 622), and the subsequent registers remain ½. After the third iteration of loop 315, the third weight is determined to be ¾ (as shown in register 633), and the subsequent registers remain ½. After the fourth iteration of loop 315 the fourth weight is determined to be 1/16 (as shown in register 644), and the subsequent register remains ½. After the fifth (final) iteration of loop 315, the fifth weight is determined to be ⅛ (as shown in register 655). The final set of weights is (¼, ⅞, ¾, 1/16, ⅛) as shown in 650. The corresponding binary values are (010, 101, 110, 011, 001) and would be used in production LBIST testing.

(Note that a default values other than ½ may be used for blocks following the current block. The set of weights used here is one example and others are possible. Also, the ordering of the weights can be different. Additionally, criteria of optimality different than the simple "greatest number of changes" may be employed.)

In alternative embodiments, the weight determination may involve multiple scan chains at each step and may therefore necessitate working with groups of weights rather than individual weights. There may also be a need to ensure that testing is performed with specific combinations of some scan chain latch values. For example, it may be known that a specific set of inputs are needed to exercise specific regions of logic. An example is illustrated in FIG. 7.

Figure 7:
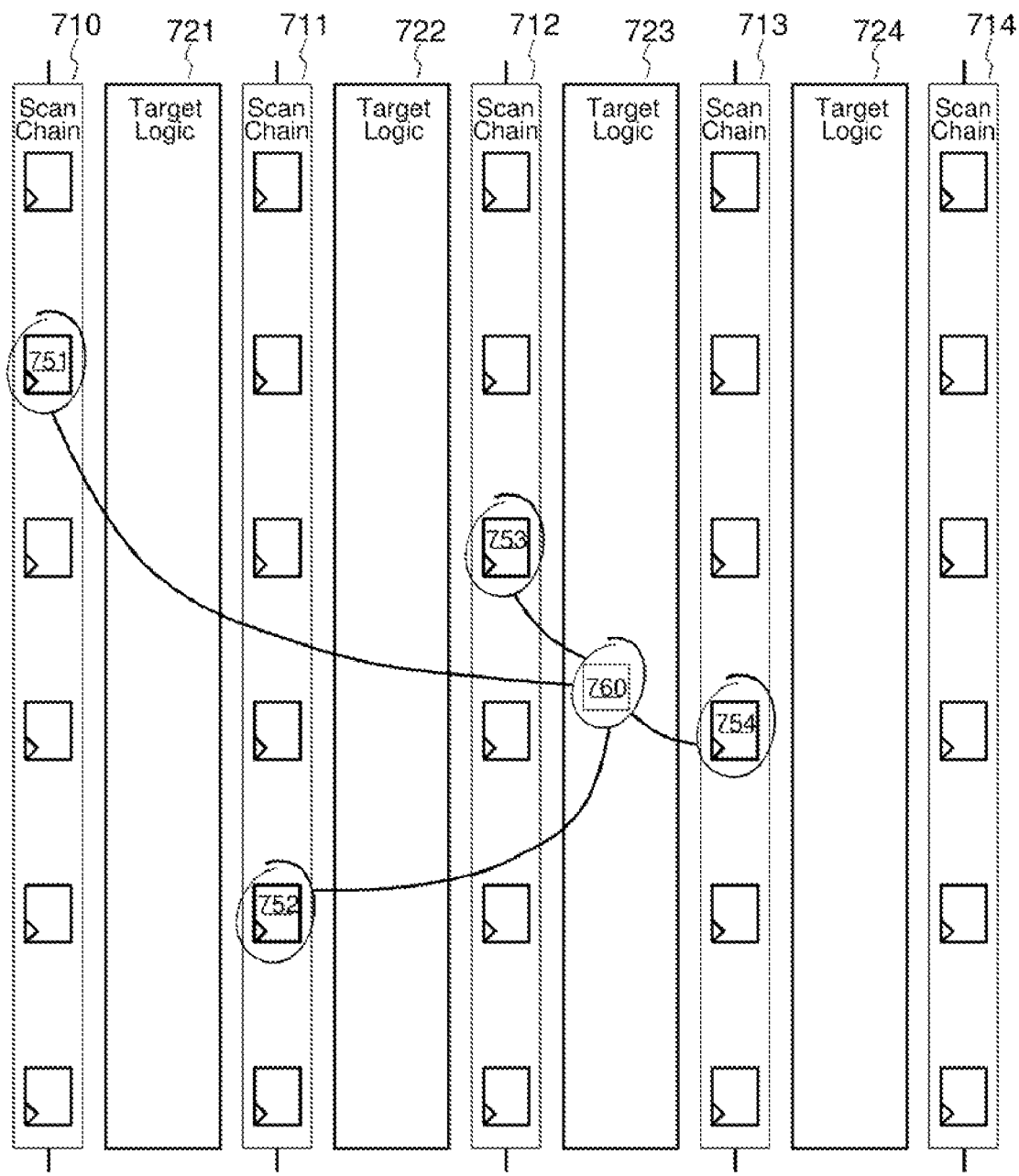
FIG. 7 is a diagram illustrating an exemplary relationship of scan chain latches to functional logic in accordance with one embodiment.

As shown in FIG. 7, logic 760 within target logic block 723 is affected by the values in scan chain latches 751-754. In order to ensure that logic 760 is fully exercised during LBIST testing, it is necessary to ensure that the values in scan chain latches 751-754 are set appropriately. For instance, it may be necessary to ensure that, at some point in the testing, every possible combination of the four bits appears in these latches. Consequently, in this embodiment, the bit patterns that are scanned into the scan chains would be examined to determine whether each of the combinations of bits is loaded into scan chain latches 751-754. If they are not, then it may be necessary to use different seed values and/or scan chain weights in order to ensure that the necessary combinations of bits appear in the latches. The determination of whether the desired combinations of bits appear in the scan chain latches is therefore effectively another type of metric that can be used in the methods described above for evaluating whether or not a particular seed value or weight should be selected for an LBIST test.

While the foregoing description presents several specific exemplary embodiments, there may be many variations of the described features and components in alternative embodiments. For example, different logic gates may be used (e.g., XOR gates many be substituted for the AND gates illustrated in the exemplary weight logic). Also, the number weight logic inputs need not be limited to four as in the described embodiments. The IC may be designed to provide alternatives to the data provided by the pre- and post-scan chain taps. The procedure might also involve a sampling of the scan chain values rather than an examination of all latch values. The input bit patterns may be augmented with their complements to improve fault coverage. Also, some weights may be simultaneously determined. Many other variations will also be apparent to persons of skill in the art of the invention upon reading the present disclosure.

Those of skill in the art will understand that information and signals may be represented using any of a variety of different technologies and techniques. For example, data, instructions, commands, information, signals, bits, and symbols that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs,) field programmable gate arrays (FPGAs) or other logic devices, discrete gates or transistor logic, discrete hardware components, or any combination thereof designed to perform the functions described herein.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an IC.

The benefits and advantages which may be provided by the present invention have been described above with regard to specific embodiments. These benefits and advantages, and any elements or limitations that may cause them to occur or to become more pronounced are not to be construed as critical, required, or essential features of any of all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A method for selecting a seed value and individual weighting values for use in an LBIST system, the method comprising:

determining metric values associated with a plurality of trial combinations of a potential seed value for a pseudorandom bit pattern generator of the LBIST system and potential individual weighting values for a plurality of channels of the LBIST system; and selecting an optimal combination based on the metric values associated with the trial combinations, wherein selecting the optimal combination comprises:

identifying a set of latches in the plurality of LBIST channels;

identifying one or more desired test states of the identified set of latches;

for each of the plurality of trial combinations, determining whether the desired test states of the identified set of latches are generated by the LBIST system; and selecting one of the trial combinations in which the desired test states of the identified set of latches are generated.

2. The method of claim 1, wherein determining the metric values and selecting the optimal combination comprises:

selecting a seed value for the pseudorandom bit pattern generator and a weighting value for a first LBIST channel based on a first metric as applied to the first channel; and using the selected seed value, for each of a plurality of subsequent LBIST channels, selecting a weighting value for each of the subsequent LBIST channels based on the first metric as applied to each of the subsequent channels.

3. The method of claim 2, wherein the first metric comprises a count of the differences between the computed bits captured in an output scan chain following a functional phase from these corresponding bits stored in the output scan chain immediately preceding the functional phase.

4. The method of claim 2, wherein the first metric comprises a comparison of the input bits for one of the LBIST channels to corresponding bits stored in a database of desired input states.

5. The method of claim 2, wherein the seed value is selected manually.

6. The method of claim 2, wherein the seed value is selected based on a metric value associated with the seed value.

7. The method of claim 6, wherein the metric value associated with the seed value is determined for the seed value in combination with a first LBIST channel.

8. The method of claim 2, wherein selecting the weighting value for each LBIST channel comprises:

selecting a first potential weighting value and determining a metric value associated with the first potential weighting value;

storing the first potential weighting value as a tentative weighting value; and for each of one or more subsequent potential weighting values, selecting the subsequent potential weighting value and determining a metric value associated with the subsequent potential weighting value, and storing the subsequent potential weighting value as the tentative weighting value if the metric value associated with the subsequent potential weighting value is greater than the metric value associated with the tentative weighting value.

9. The method of claim 1, further comprising performing LBIST testing on a device under test using the selected optimal combination of seed and weighting values.

* * * * *